(12) United States Patent
Boerstler et al.

(10) Patent No.: US 6,384,649 B1
(45) Date of Patent: May 7, 2002

(54) APPARATUS AND METHOD FOR CLOCK SKEW MEASUREMENT

(75) Inventors: David William Boerstler, Round Rock; Sani Richard Nassif, Austin, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/791,150

(22) Filed: Feb. 22, 2001

(51) Int. Cl.$^7$ .............................................. H03L 7/06
(52) U.S. Cl. ...................................... 327/156; 327/161
(58) Field of Search ................................ 327/155, 156, 327/158, 159, 161, 269, 270, 271, 252; 331/DIG. 3; 375/215, 226, 375

(56) References Cited

U.S. PATENT DOCUMENTS

| | | | |
|---|---|---|---|
| 5,003,256 A | | 3/1991 | Merrill |
| 5,122,978 A | | 6/1992 | Merrill |
| 5,235,566 A | | 8/1993 | Merrill |
| 6,184,753 B1 | * | 2/2001 | Ishimi et al. ............... 327/269 |
| 6,252,443 B1 | * | 6/2001 | Dortu et al. ................ 327/156 |
| 6,304,116 B1 | * | 10/2001 | Yoon et al. .................. 327/158 |
| 6,320,436 B1 | * | 11/2001 | Fawcett et al. ............. 327/158 |

OTHER PUBLICATIONS

"On-chip picosecond time measurement," Vadim Gutnik and Anantha Chandrakasan, Massachusetts Institute of Technology, Cambridge, MA 02139, 2000 Symposium on VLSI Circuits Digest of Technical Papers, 0–7803–6308–6/00/$10.00(c)2000 IEEE.

* cited by examiner

Primary Examiner—Kenneth B. Wells
Assistant Examiner—Linh Nguyen
(74) Attorney, Agent, or Firm—Casimer K. Salys; Bracewell & Patterson, L.L.P.

(57) ABSTRACT

An apparatus and method for measuring clock skew in a digital system. A phase detector generates an error signal proportional to a phase difference between signals applied to first and second phase detector inputs. A controlled oscillator produces an output signal having a frequency that is proportional to the filtered error signal. In accordance with the method of the present invention, the feedback path from the output of the controlled oscillator to the second input of the phase detector is opened. A sequence of pairs of mutually delayed signals are applied to the first and second phase detector inputs to obtain a range of delay reference values. A pair of skew measurement node signals from within the digital system are applied to the first and second phase detector inputs to obtain a skew response. The skew response is evaluated with respect to the range of delay reference values to obtain a skew result.

17 Claims, 3 Drawing Sheets

APPARATUS AND METHOD FOR CLOCK SKEW MEASUREMENT

BACKGROUND OF THE INVENTION

1. Technical Field

The present invention relates in general to clock distribution in digital systems, and in particular to an apparatus and method for accurately and unintrusively measuring clock skew.

2. Description of the Related Art

Computer systems and other digital electronic systems are made up of individual devices that must communicate with each other. These devices are interconnected via busses that serve as the inter-device communication medium. Such busses may operate either synchronously or asynchronously.

Whereas an asynchronous bus is not clocked, a synchronous bus employs a clock signal that is applied within the bus control lines. A fixed protocol is incorporated within a synchronous bus for facilitating communication relative to the timing of the clock signal. For example, when a processor-memory bus performs a read from memory, the protocol utilized therein may transmit the address and read command over bus control lines on the first clock cycle to indicate the desired read request. The target memory device may respond with the requested data word on the sixth clock cycle. This type of synchronous protocol can be implemented easily as a simple finite state machine.

One major disadvantage of synchronous busses is that as bus length increases, clock skew becomes a problem. Clock skew is the difference in absolute time between when two bus elements receive a clock edge. Clock skew arises when a clock signal travels over at least two different paths, having different delays, to reach different bus elements. Edge-triggered devices within a synchronously bussed system are particularly sensitive to clock skew since such devices require relatively precise clock edge timing.

Clock skew is typically minimized through a two-step process of first measuring or simulating it and then inserting appropriate tuning circuitry in the clock distribution paths. These steps may be performed at the board level, from a clock source point on the board to the clock input of each integrated circuit device on the board. These steps may also be performed on a system level, from a system clock source point to the clock source points of each board in the system. The ever-increasing speeds of current and future digital systems together with the trend toward System On Chip (SOC) devices may necessitate clock tuning between state devices such as latches fabricated on the same integrated circuit chip. The present invention relates to the measurement step in this process.

Measurement of clock skew on bussed devices such as microprocessors presents difficulties due to the loading of sensitive internal circuits and the dependence on extremely sensitive laboratory equipment. Conventional measurements of low skew (<50 psec) require probes that operate over very narrow time bases. Such probes often impose load capacitances that distort the clock distribution. E-beam and photoemission microscopy are alternative clock skew techniques that avoid the problem of capacitive loading, but are expensive, difficult to calibrate and maintain, and require extended sample times that are prone to drift.

From the foregoing, it can be appreciated that a need exists for an inexpensive clock skew measurement system that is suitable for unintrusively measuring very low skew.

SUMMARY OF THE INVENTION

An apparatus and method for measuring clock skew in a digital system are disclosed herein. A phase detector generates an error signal proportional to a phase difference between signals applied to first and second phase detector inputs. A controlled oscillator produces an output signal having a frequency that is proportional to the filtered error signal. In accordance with the method of the present invention, a feedback path from the output of the controlled oscillator to the second input of the phase detector is opened. A sequence of pairs of mutually delayed signals are applied to the first and second phase detector inputs to obtain a range of delay reference values. A pair of signals from different nodes within the digital system are applied to the first and second phase detector inputs to obtain a skew response. The skew response is evaluated with respect to the range of delay reference values to obtain a skew result.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

This invention is described in a preferred embodiment in the following description with reference to the figures. While this invention is described in terms of the best mode for achieving this invention's objectives, it will be appreciated by those skilled in the art that variations may be accomplished in view of these teachings without deviating from the spirit or scope of the present invention.

Figure 1:
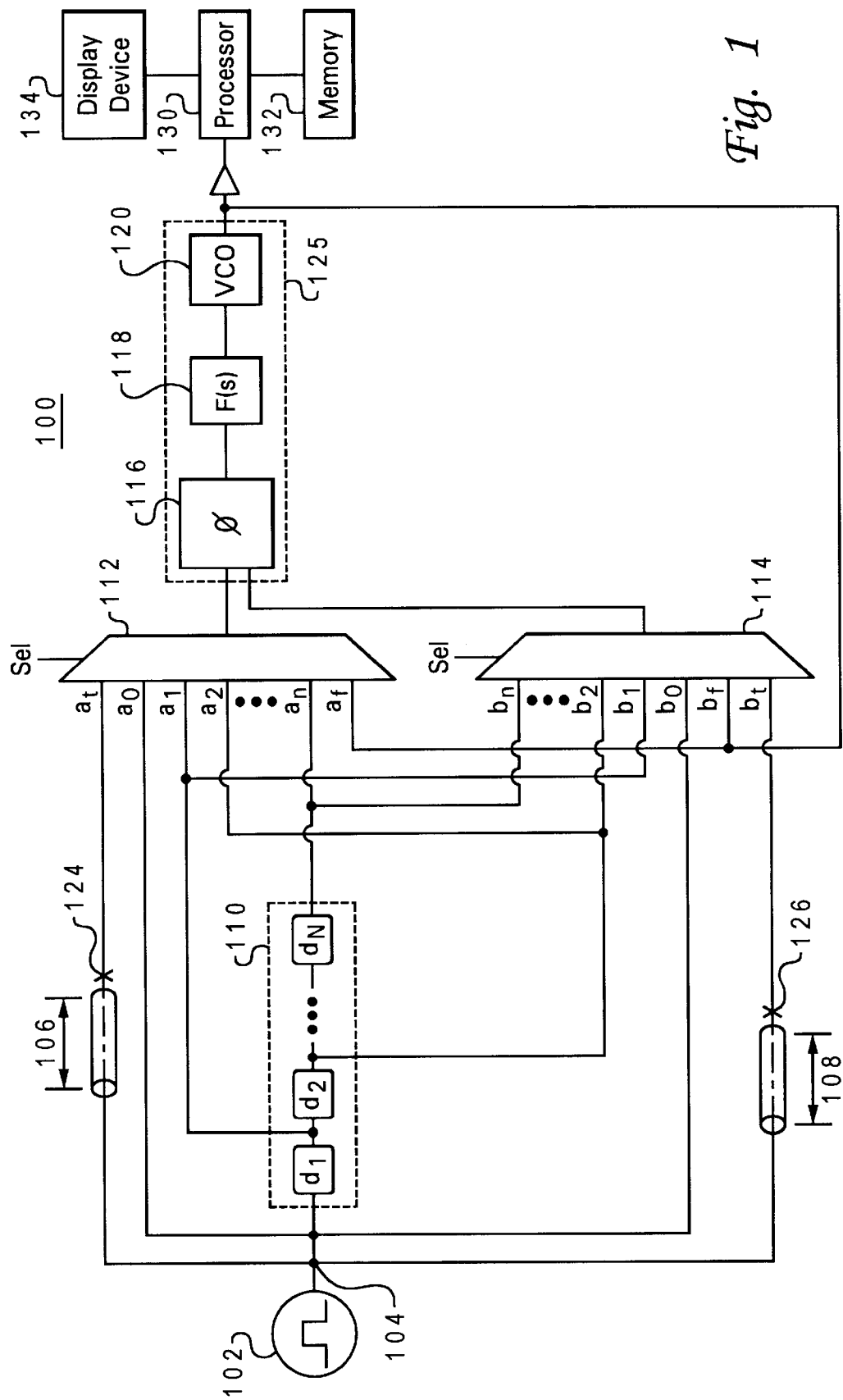
FIG. 1 illustrates a clock skew measurement apparatus designed in accordance with a preferred embodiment of the present invention.

With reference now to the figures and in particular with reference to FIG. 1, there is depicted a clock skew measurement apparatus 100 designed in accordance with a preferred embodiment of the present invention. Clock skew measurement apparatus 100 may be advantageously utilized to determine the skew experienced by a clock signal generated at a common clock source node 104 between a first skew measurement node 124 and a second skew measurement node 126.

In accordance with the depicted embodiment, skew measurement nodes 124 and 126 may be latch input points within a digital system. An excessive clock skew between such nodes will interfere with synchronous data transfer. The present invention provides a means for determining the skew between such nodes such that clock signal tuning may be incorporated if necessary.

As illustrated in FIG. 1, clock skew measurement apparatus 100 includes a tapped delay line 110 that receives a clock signal from a clock source 102 at clock source node 104. Tapped delay line 110 consists of n delay elements, $d_1$, $d_2, \ldots d_n$. The delay elements may be active or passive electronic elements. A delayed tap output is provided after each of delay elements $d_1, d_2, \ldots d_n$.

The outputs from delay line 110 are applied as inputs to a pair of multiplexors 112 and 114, which also receive skew measurement nodes 124 and 126 as inputs at $a_r$ and $b_r$, respectively. Each of multiplexors 112 and 114 select a single signal from among the delay line outputs and one or more skew measurement nodes.

As further depicted in FIG. 1, the outputs of multiplexors 112 and 114 are connected as inputs to a phase detector 116. Phase detector 116 generates an error signal, $\epsilon$, that is proportional to a phase difference detected between signals applied to the two phase detector inputs. The error signal $\epsilon$ from phase detector 116 is filtered by a low-pass filter 118 prior to being applied as the control voltage input to a voltage controlled oscillator (VCO) 120.

In the depicted embodiment, phase detector 116, low-pass filter 118, and VCO 120 are configured as a phase-locked loop (PLL) 125 when the output of VCO 120 is applied as a feedback input into phase detector 116. A PLL is a closed loop frequency and phase control system that is commonly utilized for clock signal synchronizing or multiplication based on the phase-sensitive detection of a difference in phase between signals applied to the two inputs of the phase detector component, i.e., an external input signal and the output signal from the controlled oscillator.

In accordance with the depicted embodiment, skew measurement apparatus 100 is initially calibrated by operating PLL 125 in closed-loop mode. Such initial calibration may be performed, for example, by having multiplexor 112 select undelayed input $a_0$ from clock source node 104 as one input into phase detector 116 while multiplexor 114 selects feedback input $b_f$ from the output of VCO 120 as the other phase detector input. During initial calibration, skew measurement apparatus 100 is thus configured as a conventional PLL, allowing the frequency range of VCO 120 to be verified in accordance with its design specifications or simulation results. The frequency response is recorded by sweeping the frequency of source clock 102 and obtaining the output frequency from VCO 120. A processor 130 and an associated memory device 132 are suitably incorporated to receive the output signal from VCO 120 and thus facilitate the calibration process.

To commence the final calibration step, skew measurement apparatus 100 is taken out of PLL operating mode by opening the feedback path from the output of VCO 120 to the input of phase detector 116 (i.e., neither input $a_f$ nor input $b_f$ are selected by multiplexors 112 or 30 114, respectively). With skew measurement apparatus 100 in open-loop mode, multiplexors 112 and 114 apply signals from delay line 110 to the inputs of phase detector 116 to obtain a reference phase error profile from the output of VCO 120.

At each delay element node after clock source node 104, delayed tap outputs provide n incrementally delayed clock signals as inputs to multiplexors 112 and 114. It should be noted that the electrical contacts or conductive paths connecting the delayed tap outputs from delay line 110 to the inputs $a_{0, a1, a2}, \ldots a_n$, and $b_0, b_1, b_2, \ldots b_n$ are sufficiently short such that a negligible skew is imparted therefrom.

An exemplary reference phase error profile from VCO 120 is obtained as follows. While multiplexor 112 selects undelayed input $a_0$, delayed inputs $b_1, b_2, \ldots b_n$ are sequentially selected by multiplexor 114. Phase detector 116 generates an error signal, $\epsilon$, that is proportional to a phase difference detected between clock pulses at the undelayed input $a_0$ and the same clock pulses delayed over delay elements $d_1, d_2, \ldots d_n$. The error signal from phase detector 116 is filtered by low-pass filter 118 prior to being applied as the control voltage input to VCO 120, which responds by generating an output signal having a frequency that is proportional to $\epsilon$.

During the sequential selection of mutually delayed signals from delay line 110, processor 130 in concert with memory device 132 records the output frequency from VCO 120 for each mutually delayed clock signal input pair. A range of phase errors corresponding to the clock signal delays are determined in accordance with the output frequencies from VCO 120. The VCO gains determined during the initial calibration may then be utilized by processor 130 to compute a phase error versus control voltage profile such as that illustrated in FIG. 3. Such a phase error versus control voltage profile may be displayed on a display device 134. A complementary phase error profile is obtained by selecting undelayed input $b_0$ as the output from multiplexor 114 while multiplexor 112 sequences through delayed inputs $a_1, a_2, \ldots a_n$.

After calibration, skew measurement apparatus 100 is utilized to determine the clock signal skew between skew measurement nodes 124 and 126. In a preferred embodiment of the present invention, skew measurement nodes 124 and 126 are latch input nodes. Clock signals generated by source clock 102 arrive at skew measurement node 124 via a signal path 106 and are applied to multiplexor 112 as a skew measurement input $a_r$. The same clock signals from clock source node 104 travel over a different signal path 108 before reaching skew measurement node 126 and a second skew measurement input $b_r$.

After the reference phase error versus control voltage profile has been produced, multiplexors 112 and 114 select skew measurement nodes 124 and 126, respectively. Phase detector 116 detects a phase difference between the clock signals applied to skew measurement nodes 124 and 126 from clock source node 104.

A DC control voltage from the resultant error signal $\epsilon$ induces a frequency response from VCO 120, which in conjunction with the VCO gain data obtained during calibration, characterizes the phase error versus control voltage response for the skew measurement nodes that will be referred to herein as the "skew response."

Processor 130 then evaluates the skew response with respect to the range of references phase error values within the reference phase error versus control voltage profile obtained during calibration to determine a skew result in terms of absolute time. If the skew response does not precisely coincide with one of the reference phase error data points, the closest reference phase error points may be interpolated with respect to the skew response to obtain the skew result.

Figure 2:
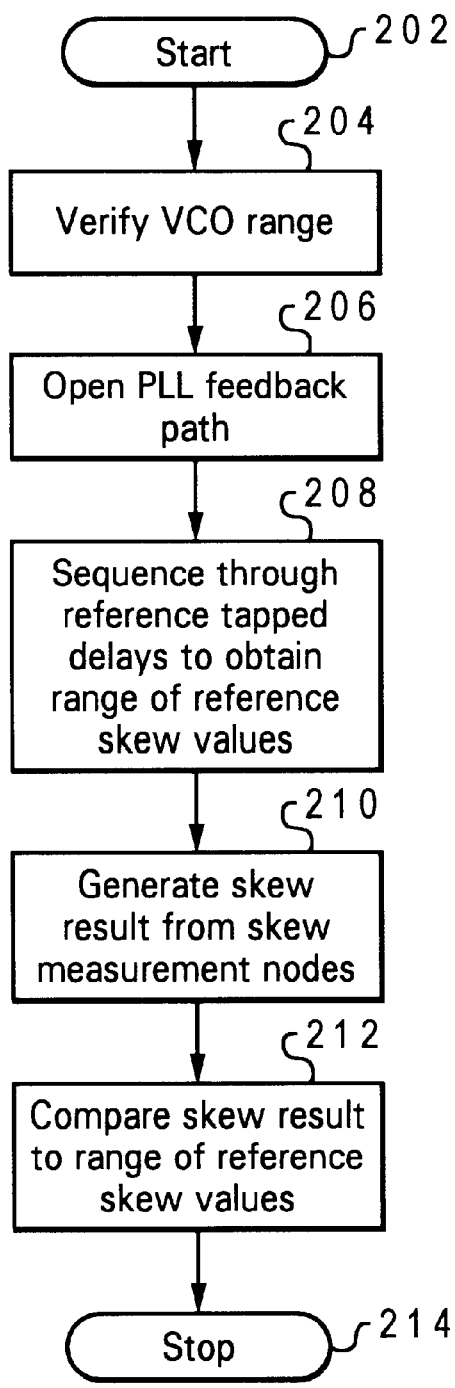
FIG. 2 is a flow diagram depicting steps performed during skew measurement in accordance with a preferred embodiment of the present invention.

Turning to FIG. 2, there is illustrated a flow diagram depicting steps performed by skew measurement apparatus 100 in accordance with a preferred embodiment of the present invention. The process begins as shown at step 202 and proceeds to step 204 which depicts the initial skew measurement apparatus calibration step in which the frequency response of VCO 120 is verified. The purpose of such verification is to ascertain the frequency range of VCO 120 and subsequently to infer its gain from design and simulation data. Direct measurement of the gain of VCO 120 could be performed using alternate measurement techniques. Such frequency response verification may be performed on PLL 125 by selecting feedback signal $b_f$ and undelayed signal $a_0$ as inputs into phase detector 116. The clock signal from clock source node 104 is than swept across a range of frequencies to determine the corresponding output frequency range of VCO 120.

Figure 3:
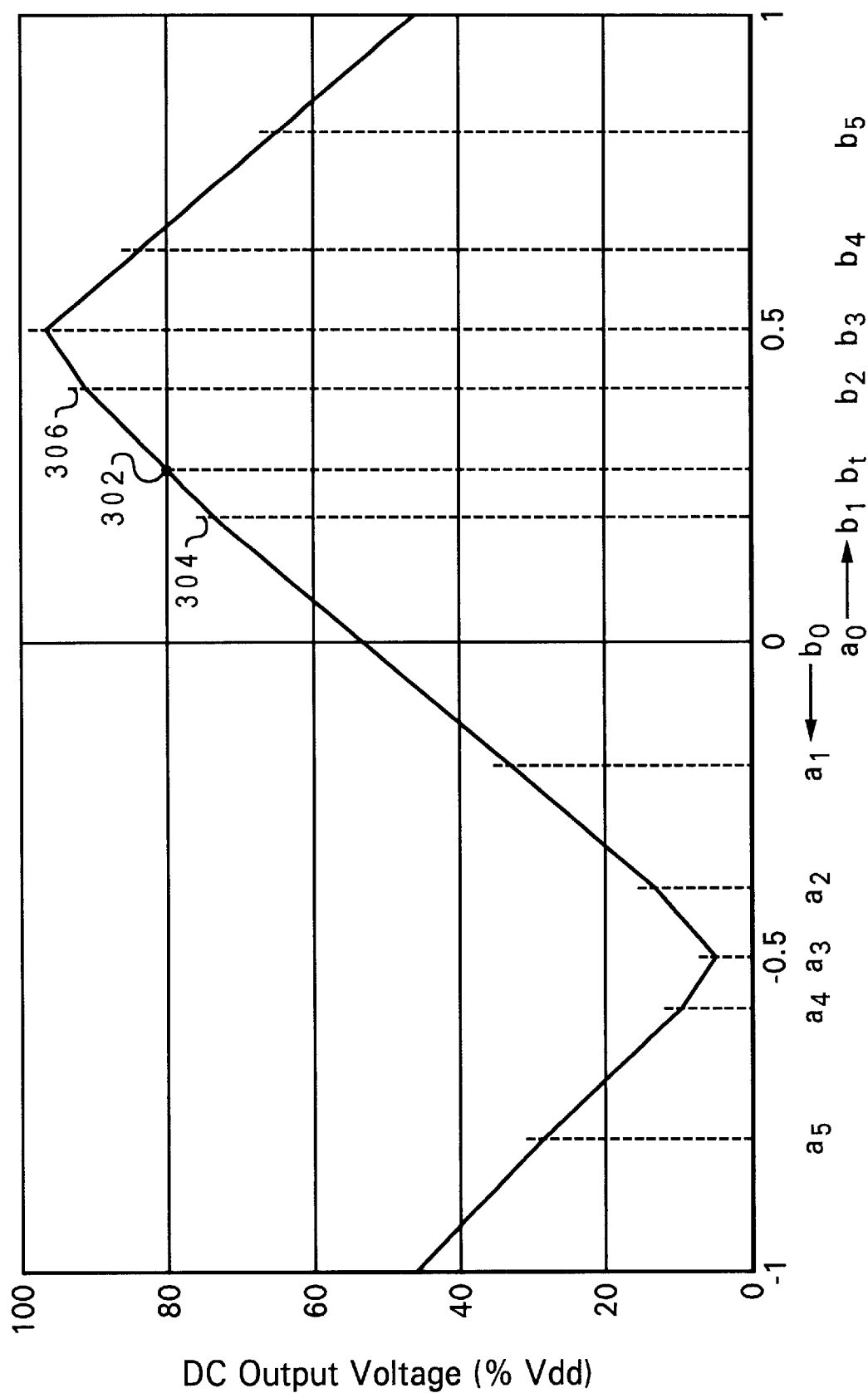
FIG. 3 is a graphical representation of skew measurement values as determined by the clock skew measurement apparatus of FIG. 1.

After the initial calibration, the feedback path from PLL 125 is opened as illustrated at step 206 by deselecting feedback signal $b_f$. With PLL 125 in open-loop mode, a range of skew reference values is obtained as follows. As depicted at step 208, a sequence of pairs of mutually delayed clock signals originating from clock 102 and delayed through delay line 110 are applied to the inputs of phase detector 116. For each mutually delayed signal input, phase detector 116 generates an error signal proportional to a phase difference detected between the signals selected as inputs. After being filtered by low-pass filter 118, these error signals serve as input control voltages for VCO 120, which responds by generating an output signal having a frequency that is proportional to each DC control voltage level. As part of step 208, a VCO control voltage versus phase error profile such as that depicted in FIG. 3 is obtained. As explained in further detail with reference to FIG. 3, such a profile provides a range of reference phase error values in accordance with the known delay imparted by each of the n delay elements within delay line 110.

Proceeding to step 210, a skew response is determined by applying skew measurement node 124 and skew measurement node 126 to the inputs of phase detector 116.

The frequency of the resultant signal from the output of VCO 120 is measured and combined with the VCO gain information obtained in calibration step 204, to obtain a phase error point corresponding to the skew response. The process concludes as illustrated at steps 212 and 214 by comparing the skew response with the range of reference delay values to determine a skew result.

With reference to FIG. 3, there is depicted a graphical representation of delay reference values obtained at step 208 of FIG. 2 as measured by the clock skew measurement apparatus of FIG. 1 wherein the number of delay elements, n, is five. FIG. 3 illustrates DC control voltage levels as a function of the reference phase error values (error $\epsilon$).

In its linear operating region, VCO 120 will produce an output frequency that is Kv times the input control voltage, wherein Kv is the VCO gain usually expressed in MHz/V. As illustrated in FIG. 3, five negative reference phase error values correspond to five delayed reference signal sequences as described with reference to FIGS. 1 and 2, with $b_0$ as the undelayed reference and $a_1$, $a_2$, $a_3$, $a_4$, and $a_5$ as the delayed references. Similarly, five positive reference phase error values correspond to delayed references $b_1$, $b_2$, $b_3$, $b_4$, and $b_5$ and undelayed reference $a_0$. A skew response 302 corresponding to a measurement between skew measurement nodes 124 and 126 falls between reference phase error values 304 and 306, which correspond to delayed references $b_1$ and $b_2$, respectively. In a preferred embodiment of the present invention, a skew result for skew response 302 in terms of absolute time is determined by interpolating reference delays $b_1$ and $b_2$ with respect to $b_r$.

While the invention has been particularly shown and described with reference to a preferred embodiment, it will be understood by those skilled in the art that various changes in form and detail may be made therein without departing from the spirit and scope of the invention.

What is claimed is:

1. An apparatus for measuring signal skew between a plurality of nodes within a digital system comprising:
   a phase detector having a first input and a second input;
   a tapped delay line having a plurality of increasingly delayed tap outputs; and
   selection means that selectively apply inputs from among said delay tap outputs and a plurality of skew measurement nodes to said first and second phase detector inputs such that the skew between a pair of skew measurement nodes may be determined relative to the phase difference between said plurality of delayed tap outputs.

2. The apparatus of claim 1, wherein said delay line comprises a plurality of active or passive delay elements.

3. The apparatus of claim 1, wherein a clock signal is applied to said delay line to generate incrementally delayed clock signals at said plurality of delayed tap outputs.

4. The apparatus of claim 1, wherein said selection means further comprises:
   a first multiplexor that selects said first phase detector input from among said delay tap outputs and at least one skew measurement node; and
   a second multiplexor that selects said second phase detector input from among said delay tap outputs and at least one skew measurement node.

5. The apparatus of claim 1, wherein said phase detector produces an error signal proportional to a phase difference between a signal applied to said first input and a signal applied to said second input.

6. The apparatus of claim 5, further comprising a controlled oscillator that receives said error signal as an input and generates a periodic signal having a frequency that is proportional to said error signal.

7. The apparatus of claim 6, further comprising:
   a processor for translating said periodic signal into a phase error signal; and
   a memory device for storing said phase error signal.

8. The apparatus of claim 6, wherein said controlled oscillator is a voltage controlled oscillator.

9. The apparatus of claim 6, further comprising a filter connected between said phase detector and said controlled oscillator.

10. The apparatus of claim 9, further comprising signal feedback means for connecting the output of said controlled oscillator to the input of said phase detector such that said phase detector, said filter, and said controlled oscillator form a phase-locked loop.

11. The apparatus of claim 10, wherein said signal feedback means further comprises a switch for disconnecting the output of said controlled oscillator from the input of said phase detector such that said phase-locked loop is in open-loop mode during skew measurements.

12. A method for utilizing a phase-locked loop to measure clock skew within a digital system, wherein said phase-locked loop includes a phase detector that generates an error signal proportional to a phase difference between signals applied to first and second phase detector inputs, said phase-locked loop further including a controlled oscillator that produces an output signal having a frequency that is proportional to said error signal, said method comprising:
   opening a feedback path from the output of said controlled oscillator to said second input of said phase detector;
   applying a sequence of pairs of mutually delayed signals to said first and second phase detector inputs to obtain a range of delay reference values;
   applying a first skew measurement node signal from within said digital system to said first phase detector input and a second skew measurement node signal within said digital system to said second phase detector input to obtain a skew response; and evaluating said skew response with respect to said plurality of delay reference values to obtain a skew result.

13. The method of claim 12, wherein said step of applying a sequence of pairs of mutually delayed signals to said first and second phase detector inputs is preceded by the step of calibrating said phase-locked loop in closed loop mode.

14. The method of claim 13, wherein said calibrating step further comprises:

closing said feedback path from the output of said controlled oscillator to said second phase detector input;

applying a clock signal to said first phase detector input; and sweeping said clock signal through a range of frequencies to validate a control voltage output response of said controlled oscillator.

15. The method of claim 12, wherein said evaluating step further comprises:

comparing said skew response with said range of delay reference values to identify at least two delay reference values closest to said skew response;

associating said closest delay reference values with reference delay values; and interpolating said reference delay values with respect to said skew result to obtain a delay result.

16. The method of claim 15, wherein said sequence of pairs of mutually delayed signals are generated from a tapped delay line having a plurality of increasingly delayed tap outputs, and wherein said associating step further comprises determining said reference delay values from said delayed tap outputs of said tapped delay line.

17. The method of claim 12, further comprising:

generating a display of said range of skew reference values; and generating a display of said skew result.

* * * * *